(12) United States Patent
Borie et al.

(10) Patent No.: US 12,399,776 B2
(45) Date of Patent: Aug. 26, 2025

(54) APPARATUSES AND METHODS TO PERFORM DQ SWAPPING ON MEMORY

(71) Applicant: MICRON TECHNOLOGY, INC., Boise, ID (US)

(72) Inventors: Wesley W. Borie, Boise, ID (US); Dennis G. Montierth, Meridian, ID (US); Garth N. Grubb, Boise, ID (US); Mow Yiak Goh, Boise, ID (US); Anthony M. Geidl, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 18/525,354

(22) Filed: Nov. 30, 2023

(65) Prior Publication Data
US 2024/0311238 A1    Sep. 19, 2024

Related U.S. Application Data

(60) Provisional application No. 63/490,474, filed on Mar. 15, 2023.

(51) Int. Cl.
| | |
|---|---|
| G06F 11/10 | (2006.01) |
| G06F 11/00 | (2006.01) |
| G06F 11/16 | (2006.01) |
| G11C 8/08 | (2006.01) |
| G11C 17/16 | (2006.01) |

(52) U.S. Cl.
CPC ...... *G06F 11/1068* (2013.01); *G06F 11/1654* (2013.01); *G11C 8/08* (2013.01); *G11C 17/16* (2013.01)

(58) Field of Classification Search
CPC ....... G11C 17/16; G11C 5/025; G11C 7/1045; G11C 8/08; G06F 11/1654; G06F 11/1068
See application file for complete search history.

(56) References Cited

U.S. PATENT DOCUMENTS

| | | | | |
|---|---|---|---|---|
| 6,370,668 | B1 * | 4/2002 | Garrett, Jr. | G06F 11/1044 714/763 |
| 11,087,824 | B2 * | 8/2021 | Montierth | G11C 11/4097 |
| 11,941,290 | B2 * | 3/2024 | Rajendiran | G06F 3/0644 |
| 12,142,339 | B2 * | 11/2024 | Merritt | G11C 7/1012 |
| 2011/0153925 | A1 * | 6/2011 | Bains | G06F 13/1678 711/E12.001 |
| 2024/0311231 | A1 * | 9/2024 | Ayyapureddi | G06F 11/1048 |

\* cited by examiner

*Primary Examiner* — Justin R Knapp
(74) *Attorney, Agent, or Firm* — Dorsey & Whitney LLP

(57) ABSTRACT

An exemplary memory includes a first sub-wordline (SWL) driver configured to provide first data from a memory cell array, a second SWL driver configured to provide second data from a memory cell array, and an input/output (I/O) circuit configured to receive the first data and the second data from the first and second SWL drivers, respectively. The I/O circuit including a data terminal mapping circuit configured to selectively route the first data and the second data to different respective data terminal based on a data terminal mapping setting.

19 Claims, 6 Drawing Sheets

APPARATUSES AND METHODS TO PERFORM DQ SWAPPING ON MEMORY

CROSS REFERENCE TO RELATED APPLICATION(S)

This application claims the benefit under 35 U.S.C. § 119 of the earlier filing date of U.S. Provisional Application Ser. No. 63/490,474 filed Mar. 15, 2023, the entire contents of which are hereby incorporated by reference in their entirety for any purpose.

BACKGROUND OF THE INVENTION

Memory module designs may be geared toward routing efficiency and signal integrity. As such, many memory modules may include a network of traces (e.g., a swizzle) that routes data from memory packages to an output terminal of the memory module. As part of a compromise for routing efficiency and signal integrity, some of this routing may lead to data terminals of a memory package being re-mapped in a most-significant-bit (MSB) to least-significant-bit (LSB) order to be output from the memory module that is different than the order in which the data left the memory package. This re-ordering of data may affect a host's ability to perform some error correction code operations, which may reduce reliability and robustness of the memory module.

DETAILED DESCRIPTION

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
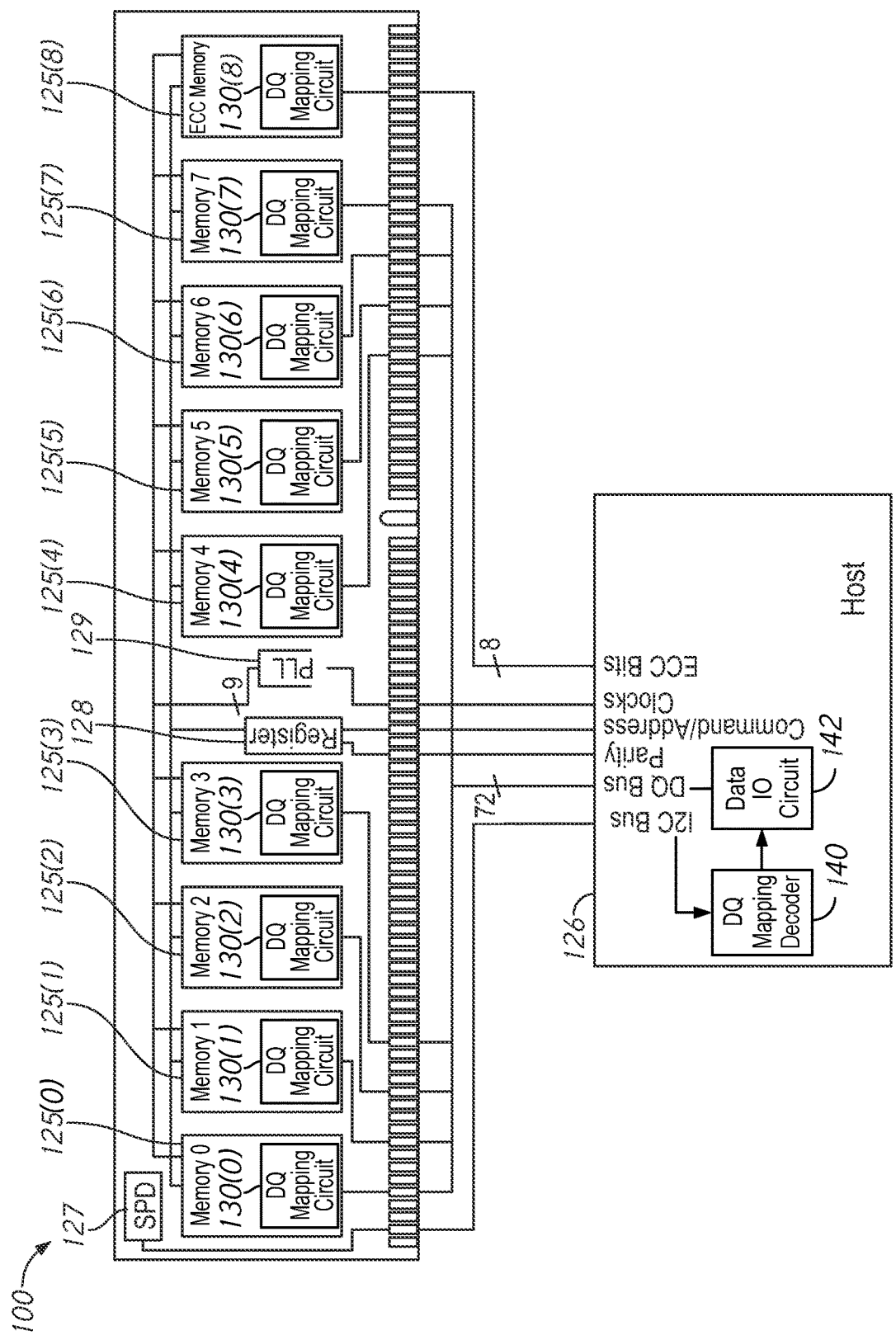
FIG. 1 is a block diagram of a memory module coupled to a host 126, in accordance with an embodiment of the disclosure.

FIG. 1 is a block diagram of a memory module 100 coupled to a host 126, in accordance with an embodiment of the disclosure. The host may be a central processing unit, in some examples. In some examples, the memory module 100 may be configured as a dual in-line memory module (DIMM). In other examples, the memory module 100 may be configured as a non-volatile DIMM (NVDIMM) that includes a combination of volatile memory devices (e.g., DRAM) and non-volatile memory devices (e.g., flash memory) (not shown).

The memory module 100 may include one or more memory packages (e.g., or memory dies) 125(0)-(8) organized together. The memory packages 125(0)-(8) may be included on one or both sides of the memory module 100. Each of the memory packages 125(0)-(8) may be any arrangement of memory package. In some embodiments the memory packages 125(0)-(8) may all be the same type of memory package. In other embodiments, the memory packages 125(0)-(8) may include a mix of different types of memory packages may be used. Although the memory module 100 shown in FIG. 1 having 9 memory packages 125(0)-(8), more or fewer packages 125(0)-(8) may be used in other embodiments. For example, in some embodiments, the memory packages 125(0)-(8) may be organized into different physical ranks. For example, there may be first physical rank on a first side of the memory module 100 (e.g., the 9 memory packages 125(0)-(8) as shown in FIG. 1) and a second physical rank on a back side of the memory module 100 (e.g., 9 more memory packages on a reverse side of the memory module 100). In some embodiments, there may be 18 packages 125(0)-(8) per physical rank, and one or more physical ranks in the memory module 100. The memory module 100 may include a serial presence detect (SPD) chip 127 configured to provide information about the memory module 100, such as number of memory packages 125(0)-(8), ranks, types of memory, swizzle mapping, etc. The memory module 100 may further include a register 128 configured to store configuration information for the memory module 100, and a phase-locked loop (PLL) circuit 129 configured to control clock timing for the memory module 100.

A host 126 may provide various command signals to the memory packages 125(0)-(8). In some examples, the memory packages 125(0)-(7) may be configured to provide data to the host 126, and the memory package 125(8) may be configured as an error correction code (ECC) memory package to provide ECC data to the host 126 to detect and correct data provided from the memory packages 125(0)-(7).

The memory module 100 may include data terminals configured to provide data from the memory packages 125(0)-(8) to the host 126 via a DQ bus. The memory module 100 may include traces coupling the data terminals of each of the memory packages 125(0)-(8) to a respective data terminal of the memory module 100 coupled to the DQ bus. This array of traces may be referred to as a swizzle, in some examples. The mapping of the data terminals of the memory packages 125(0)-(8) to the data terminals of the memory package 100 may be based on a layout of the memory packages 125(0)-(8) on the memory module 100. In some examples, for a given one of the memory packages 125(0)-(8), an order of the data terminals may be rearranged when mapped to the data terminals of the memory module 100. For example, data terminals <3:0> of the memory package 125(0) may be mapped to data terminals <0, 3, 2, 1>, respectively, of the memory module 100. This re-ordering of the data terminals from the memory packages 125(0)-(8) to the data terminals of the memory module 100 may limit a host's ability to perform some types of error correction.

Thus, in some examples, either the memory packages 125(0)-(7) or the host 126 may be configured to re-order data provided from the memory packages 125(0)-(7) to the host 126 such that the data is provided to or received from the data terminals of the memory module 100 ends up in an order that circumvents or un-does the swizzle mapping. In one embodiment, the memory packages 125(0)-(7) may each include a respective data terminal (DQ) mapping circuit 130(0)-(7) that is configured to re-arrange which data is provided to which DQ to circumvent the swizzle. For example, in the example explained above where the data terminals <3:0> of the memory package 125(0) are mapped to data terminals <0, 3, 2, 1>, respectively, of the memory module 100, normally data<3:0> would be provided to the data terminals <3:0> of the memory package 125(0), which would result in the data<3:0> being output from the memory module 100 in a different order than output from the memory package 125(0). Thus, to circumvent the swizzle re-mapping of the data<3:0>, the DQ mapping circuit 130(0) may re-map the data<3:0> to the data terminals of the memory package 125(0) such that data<3:0> is provided to data terminals <2, 1, 0, 3>, respectively, of the memory module 100. In some examples, the ECC memory package 125(8) may also include a DQ mapping circuit 130(8) that is configured to re-map data terminals for the ECC data provided from the ECC memory package 125(8).

In another embodiment, rather than the memory packages 125(0)-(7) re-mapping each of their individual data terminals, the host 126 may re-order data received from or provided to the data terminals of the memory module 100 based on the swizzle mapping. For example, the host 126 may include DQ mapping decoder 140 and a data input/output circuit 142. The SPD 127 may be programmed with swizzle mapping information for the memory module 100. The DQ mapping decoder 140 may be configured to receive the swizzle mapping information from the SPD 127 via the I2C bus. The DQ mapping decoder 140 may provide control signals to the data input/output circuit 142 to cause data received via the DQ bus to be re-arranged or re-ordered to undo the swizzle mapping. For example, in the example explained above where the data terminals <3:0> of the memory package 125(0) are mapped to data terminals <0, 3, 2, 1>, respectively, of the memory module 100, the DQ mapping decoder 140 may cause the data input/output circuit 142 to re-map data <2,1,0,3> received over the DQ bus from the data terminals <3:0> of the memory module 100 to remapped data <3:0> based on the swizzle mapping information provided from the SPD 127.

This remapping of data may be performed for both read and write operations. The remapping of data to change the swizzle mapping may improve ECC operations by facilitating more robust error detection and correction as compared with systems that do not change swizzle mapping by taking advantage of a host's error correcting schemes (e.g., error correcting code (ECC)) that rely on particular architectures of a memory package or device.

Figure 2:
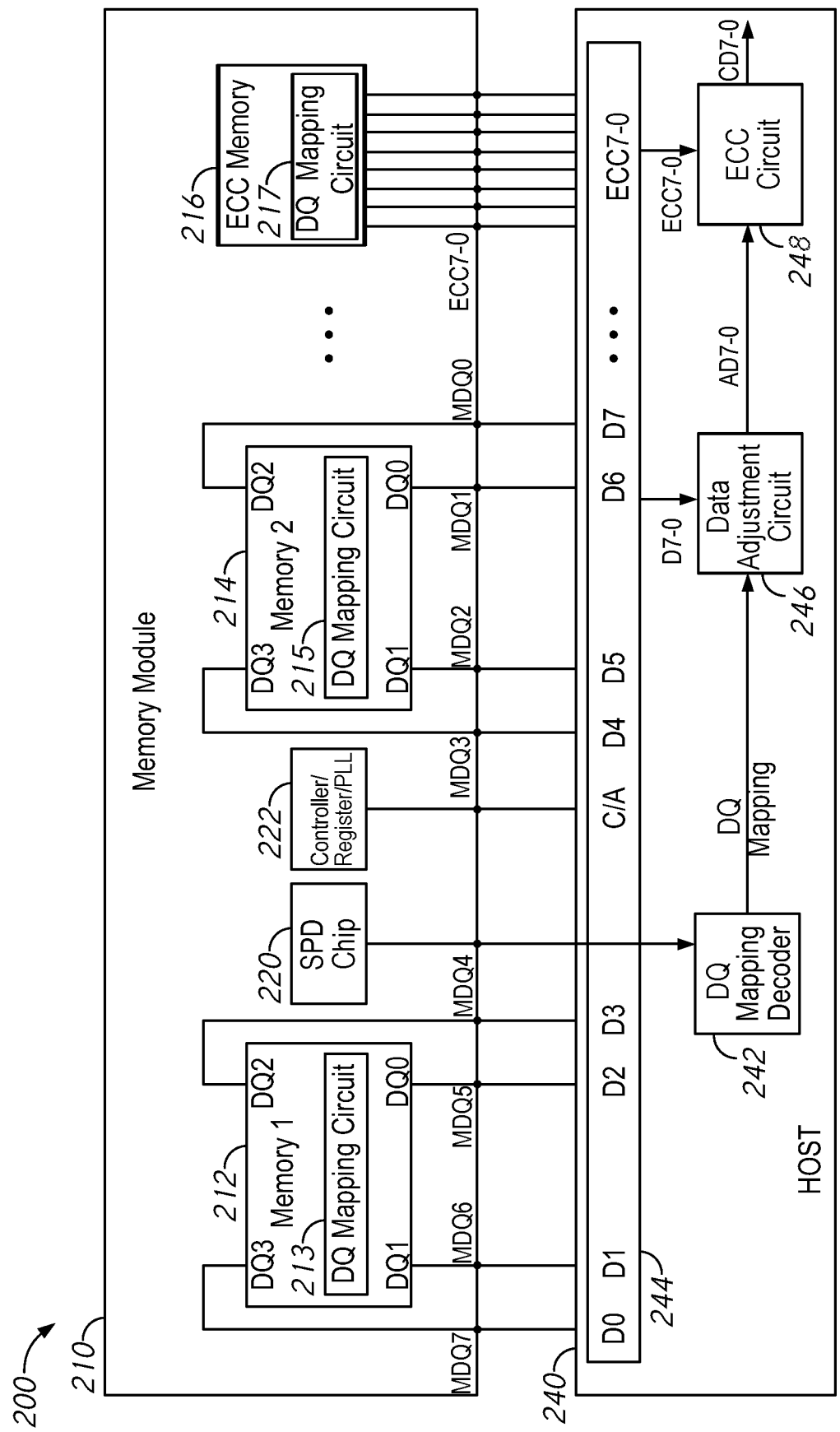
FIG. 2 is a block diagram of a memory system with a memory module coupled to a host, in accordance with an embodiment of the disclosure.

FIG. 2 is a block diagram of a memory system 200 with a memory module 210 coupled to a host 240, in accordance with an embodiment of the disclosure. In some examples, the memory module 210 may be configured as a dual in-line memory module (DIMM). In other examples, the memory module 210 may be configured as a non-volatile DIMM (NVDIMM) that includes a combination of volatile memory devices (e.g., DRAM) and non-volatile memory devices (e.g., flash memory) (not shown).

The memory module 210 may include at least memory packages (e.g., or memory dies) 212 and 214, along with an ECC memory package 216, organized together, along with a SPD chip 220 and on-board controller/register/PLL circuitry 222. The memory packages 212, 214, and 216 may be included on one or both sides of the memory module 210. Each of the memory packages 212, 214, and 216 may be any arrangement of memory package. In some embodiments the memory packages 212, 214, and 216 may all be the same type of memory package. In other embodiments, the memory packages 212, 214, and 216 may include a mix of different types of memory packages may be used. Although the memory module 210 shown in FIG. 2 having 3 memory packages 212, 214, and 216, more or fewer packages 212, 214, and 216 may be used in other embodiments. For example, in some embodiments, the memory packages 212, 214, and 216 may be organized into different physical ranks. For example, there may be first physical rank on a first side of the memory module 210 (e.g., the 3+ memory packages 212, 214, and 216 as shown in FIG. 2) and a second physical rank on a back side of the memory module 210 (e.g., 3+ more memory packages on a reverse side of the memory module 210). In some embodiments, there may be 18 packages per physical rank, and one or more physical ranks in the memory module 210. The SPD chip 220 configured to provide information about the memory module 210, such as number of memory packages 212, 214, and 216, ranks, types of memory, swizzle mapping, etc. The on-board controller/register/PLL circuitry 222 may be configured to store configuration information for the memory module 210, as well as to control clock timing for the memory module 210.

The host 240 may provide various command and address signals to on-board controller/register/PLL circuitry 222 and or to the memory packages 212, 214, and 216 via the command and address bus C/A. In some examples, the memory packages 212 and 214 may be configured to provide data to and receive data from the host 240, and the memory package 216 may be configured as an error correction code (ECC) memory package to provide ECC data to and receive ECC data from the host 240 to detect and correct data provided from the memory packages 212 and 214.

The memory module 210 may include data terminals MDQ7-0 and ECCDQ7-0 configured to provide data and ECCs from the memory packages 212, 214, and 216 to the host 240 via a DQ bus. The memory module 210 may include traces coupling the data terminals DQ3-0 of each of the memory packages 212, 214, and 216 to a respective data terminal MDQ7-0 and ECCDQ7-0 of the memory module 210. This array of traces may be referred to as a swizzle, in some examples. The mapping of the data terminals DQ3-0 of the memory packages 212, 214, and 216 to the data terminals MDQ7-0 and ECCDQ7-0 of the memory module 210 may be based on a layout of the memory packages 212, 214, and 216 on the memory module 210. In some examples, for a given one of the memory packages 212 and 214, an order of the data terminals DQ3-0 may be rearranged when mapped to the data terminals MDQ7-0 of the memory module 210. For example, in the example depicted in FIG. 2, the data terminals DQ3-0 of the memory package 212 may be mapped to data terminals MDQ 7, 4, 6, 5, respectively, of the memory module 210 and the data terminals DQ3-0 of the memory package 214 may be mapped to data terminals MDQ 3, 0, 2, 1, respectively, of the memory module 210. This re-ordering of the data terminals DQ3-0 from the memory packages 212 and 214 to the data terminals MDQ7-0 of the memory module 210 may limit an ability to perform some types of error correction.

Thus, in some examples, either the memory packages 212 and 214 or the host 240 may be configured to re-order data provided from the memory packages 212 and 214 to the host 240 such that the data is provided to or received from the data terminals MDQ7-0 of the memory module 210 ends up in an order that circumvents or un-does the swizzle mapping.

In one embodiment, the memory packages 212 and 214 may each include a DQ mapping circuit 213 and 215 that is configured to re-arrange which data is provided to which DQ to circumvent the swizzle. For example, normally, data<7:4> would be provided to the data terminals DQ3-0 of the memory package 212 and data<3:0> would be provided to the data terminals DQ3-0 of the memory package 214, which would result in the data<7:0> being output from the memory module 100 in a different order than output from the memory packages 212 and 214. Thus, to circumvent the swizzle re-mapping of the data<7:0>, the DQ mapping circuit 213 may re-map the data<7:4> to the data terminals DQ3, 1, 0, 2 of the memory package 212 to provide data<7:4> to module data terminals MDQ7-4, respectively, of the memory module 210. Similarly, the DQ mapping circuit 215 may re-map the data<3:0> to the data terminals DQ3, 1, 0, 2 of the memory package 212 to provide data<3:0> to module data terminals MDQ3-0, respectively, of the memory module 210. Accordingly, data<7:0> is received at terminals D7-0 of the host 240. In this embodiment, the data input/output circuit 244 of the host 240 may provide the AD7-0 data as the D7-0 without being rearranged, along with the ECC data, to an ECC encoder/decoder circuit configured to detect and correct errors. The data terminal DQ3-0 re-mapping information may be controlled via a mode register setting, on-die fuse settings, or a combination thereof. In some examples, the ECC memory package 216 may also include a DQ mapping circuit 217 that is configured to re-map data terminals for the ECC7-0 data provided from the ECC memory package 216.

In another embodiment, rather than the memory packages 212 and 214 re-mapping each of their individual data terminals DQ3-0, the host 240 may re-order data received from or provided to the data terminals MDQ7-0 of the memory module 210 based on the swizzle mapping. For example, the host 240 may include a DQ Mapping Decoder 242, a data input/output circuit 244, a data adjustment circuit 246, and the ECC circuit 248. The data input/output circuit 244 may be configured to receive data D7-0 and ECC7-0 from the memory module 210 via a data bus. In addition, the DQ Mapping Decoder 242 may be configured to receive swizzle mapping information from the SPD chip 220 via a dedicated bus. The SPD chip 220 of the memory module 210 may be programmed with swizzle mapping information for the memory module 210. The data input/output circuit 244 may provide the data DN-0 to the data adjustment circuit 246, and the DQ Mapping Decoder 242 may decode the swizzle mapping information to provide DQ mapping information to the data adjustment circuit 246. In response to receipt of the data D7-0 and the DQ mapping information, the data adjustment circuit 246 may adjust the data D7-0 received from the module data terminals MDQ7-0 via the DQ bus to be re-arranged or re-ordered based on the DQ mapping information (e.g., to undo the swizzle mapping). For example, the data input/output circuit 244 may re-arrange the D7-0 data to D7, 4, 6, 5, 3, 0, 2, 1 to provide arranged data AD7-0. The data adjustment circuit 246 may include switching circuits that are controllable by the DQ mapping information control signals from the DQ Mapping Decoder 242 to re-arrange the data D7-0 to provide the AD7-0. The AD7-0 and the ECC data may be provided to the ECC circuit 248 to detect and correct errors to provide corrected data CD7-0. The example shown in FIG. 2 is illustrative, and would include more than two memory modules and/or more than eight data bits without departing from the scope of the disclosure.

This remapping of data may be performed for both read and write operations. The remapping of data to undo the swizzle mapping may improve ECC operations by facilitating more robust error detection and correction as compared with systems that do not change swizzle mapping by taking advantage of a host's error correcting schemes that rely on particular architectures of a memory package or device.

Figure 3:
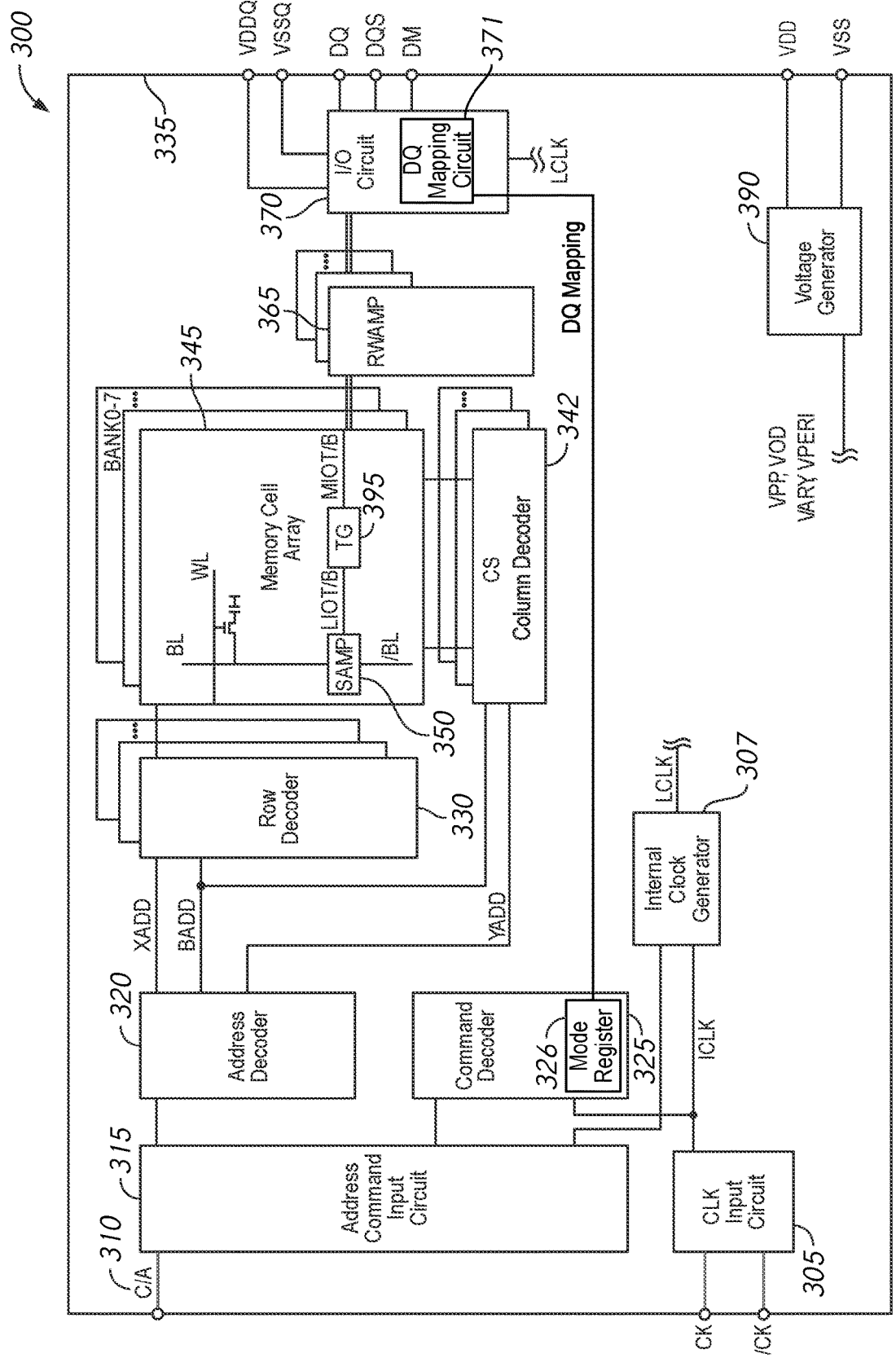
FIG. 3 is a schematic block diagram of a semiconductor device semiconductor device, in accordance with an embodiment of the present disclosure.

FIG. 3 is a schematic block diagram of a semiconductor device semiconductor device 300, in accordance with an embodiment of the present disclosure. For example, the semiconductor device semiconductor device 300 may include a chip 335. The chip 335 may include a clock input circuit 305, an internal clock generator 307, an address command input circuit 315, an address decoder 320, a command decoder 325, a plurality of row decoders 330, a memory cell array 345 including sense amplifiers 350 and transfer gates 395, a plurality of column decoders 340, a plurality of read/write amplifiers 365, an input/output (I/O) circuit 370, and a voltage generator 390. The semiconductor device semiconductor device 300 may include a plurality of external terminals including address and command terminals coupled to command/address bus 310, clock terminals CK and/CK, data terminals DQ, DQS, and DM, and power supply terminals VDD, VSS, VDDQ, and VSSQ. The chip 335 may be mounted on a substrate, for example, a memory module substrate, a mother board or the like. In some examples, the semiconductor device semiconductor device 300 may in implemented in any or all of the memory packages 125(0)-(8) of FIG. 1 and/or the memory packages 212, 214, or 216 of FIG. 2

The memory cell array 345 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. The selection of the word line WL for each bank is performed by a corresponding row decoder 330 and the selection of the bit line BL is performed by a corresponding column decoder 340. The plurality of sense amplifiers 350 are located for their corresponding bit lines BL and coupled to at least one respective local I/O line further coupled to a respective one of at least two main I/O line pairs, via transfer gates TG 395, which function as switches.

The address/command input circuit 315 may receive an address signal and a bank address signal from outside at the command/address terminals via the command/address bus 310 and transmit the address signal and the bank address signal to the address decoder 320. The address decoder 320 may decode the address signal received from the address/command input circuit 315 and provide a row address signal XADD to the row decoder 330, and a column address signal YADD to the column decoder 340. The address decoder 320 may also receive the bank address signal and provide the bank address signal BADD to the row decoder 330 and the column decoder 340.

The address/command input circuit 315 may receive a command signal from outside, such as, for example, a memory controller 305 at the command/address terminals via the command/address bus 310 and provide the command signal to the command decoder 325. The command decoder 325 may decode the command signal and provide generate various internal command signals. For example, the internal command signals may include a row command signal to select a word line, a column command signal, such as a read command or a write command, to select a bit line.

Accordingly, when a read command is issued and a row address and a column address are timely supplied with the read command, read data is read from a memory cell in the memory cell array 345 designated by the row address and the column address. The read/write amplifiers 365 may receive the read data DQ and provide the read data DQ to the IO circuit 370. The IO circuit 370 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 370 may receive write data at the data terminals DQ, together with a data strobe signal at DQS and/or a data mask signal at DM and provide the write data via the read/write amplifiers 365 to the memory cell array 345. Thus, the write data may be written in the memory cell designated by the row address and the column address.

In some examples, the semiconductor device 100 may installed on a memory module Accordingly, data terminals DQ of the semiconductor device 100 may be re-arranged in a different order when routed to the data terminals of the memory module via a swizzle, in some examples. The mapping of the data terminals of the semiconductor device 100 to the data terminals of the memory module may be based on a layout of the semiconductor device among other semiconductor devices and circuitry on the memory module. A more robust ECC may be implemented when data remains arranged according to sub-wordline drivers of the read/write amplifiers 165 configured to provide read data to the I/O circuit 170, Thus, to retain an order integrity of the data as it is retrieved from the memory cell array 145, the I/O circuit 170 may include a DQ mapping circuit 371 configured to re-arrange which data is provided to which DQ terminal to circumvent the swizzle. A 126 of the command decoder 125 is configured to store a mode register setting for DQ mapping, and to provide the DQ mapping mode register setting to the DQ mapping circuit 371. The DQ mapping information may be read from an on-die fuse settings, or may be provided from a host. In response to the DQ mapping mode register setting, the DQ mapping circuit 371 is configured to re-arrange data provided by the read/write amplifiers 165 to undo the swizzle re-arrangement of the data. The data terminal DQ3-0 re-mapping information may be controlled via a mode register setting, on-die fuse settings, or a combination thereof.

Turning to the explanation of the external terminals included in the semiconductor device semiconductor device 300, the clock terminals CK and /CK may receive an external clock signal and a complementary external clock signal, respectively. The external clock signals (including complementary external clock signal) may be supplied to a clock input circuit 305. The clock input circuit 305 may receive the external clock signals and generate an internal clock signal ICLK. The clock input circuit 305 may provide the internal clock signal ICLK to an internal clock generator 307. The internal clock generator 307 may generate a phase controlled internal clock signal LCLK based on the received internal clock signal ICLK and a clock enable signal CKE from the address/command input circuit 315. Although not limited thereto, a DLL circuit may be used as the internal clock generator 307. The internal clock generator 307 may provide the phase controlled internal clock signal LCLK to the IO circuit 370 and a timing generator 309. The IO circuit 370 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 390. The voltage generator circuit 390 may generate various internal voltages, VPP, VOD, VARY, VPERI, and the like based on the power supply voltages VDD and VSS. The internal voltage VPP is mainly used in the row decoder 330, the internal voltages VOD and VARY are mainly used in the sense amplifiers 350 included in the memory cell array 345, and the internal voltage VPERI is used in many other circuit blocks. The power supply terminals may also receive power supply voltages VDDQ and VSSQ. The IO circuit 370 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 370.

Figure 4:
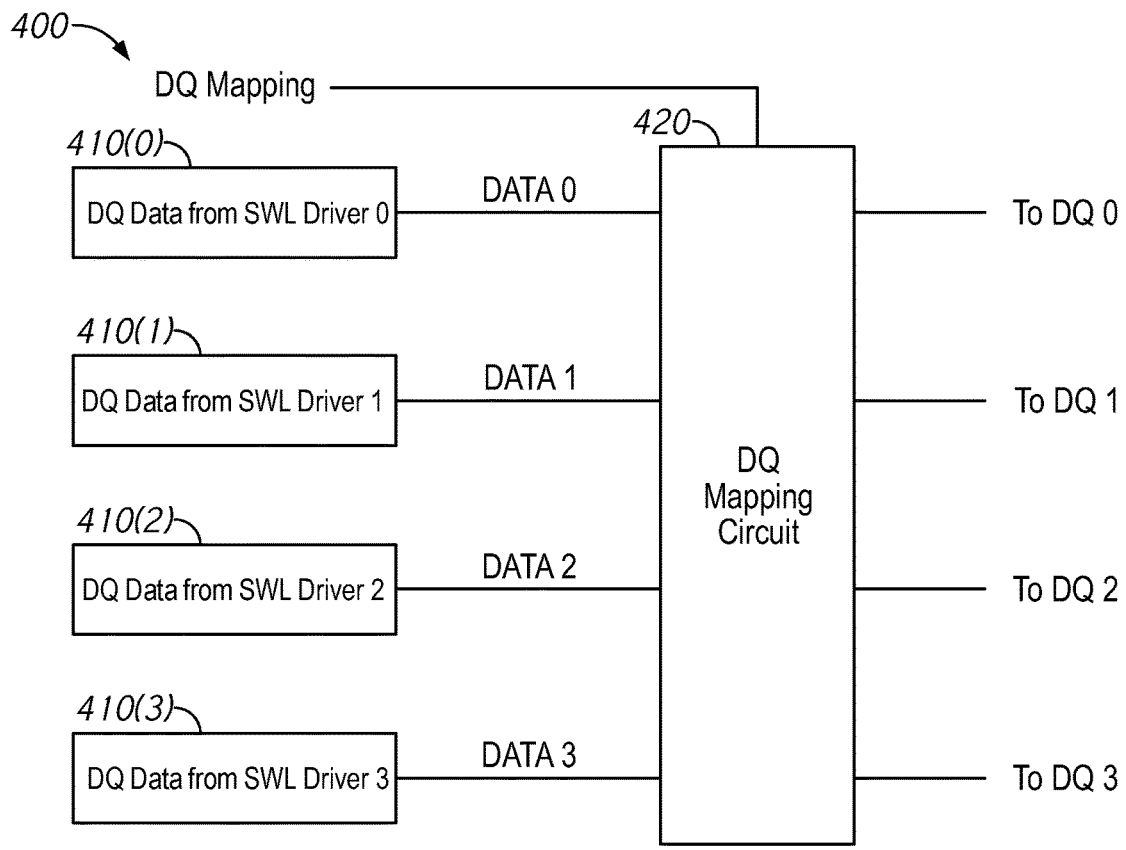
FIG. 4 is a schematic block diagram of a portion of a semiconductor device, in accordance with an embodiment of the disclosure.

FIG. 4 is a schematic block diagram of a portion of a semiconductor device 400, in accordance with an embodiment of the disclosure. The semiconductor device 400 may include DQ data from sub-wordline (SWL) drivers 410(0)-(3) coupled to a DQ mapping circuit 420. In some examples, the semiconductor device 400 may in implemented in any or all of the memory packages 125(0)-(8) of FIG. 1, the memory packages 212, 214, or 216 of FIG. 2, or the semiconductor device 300 of FIG. 3.

Figure 5:
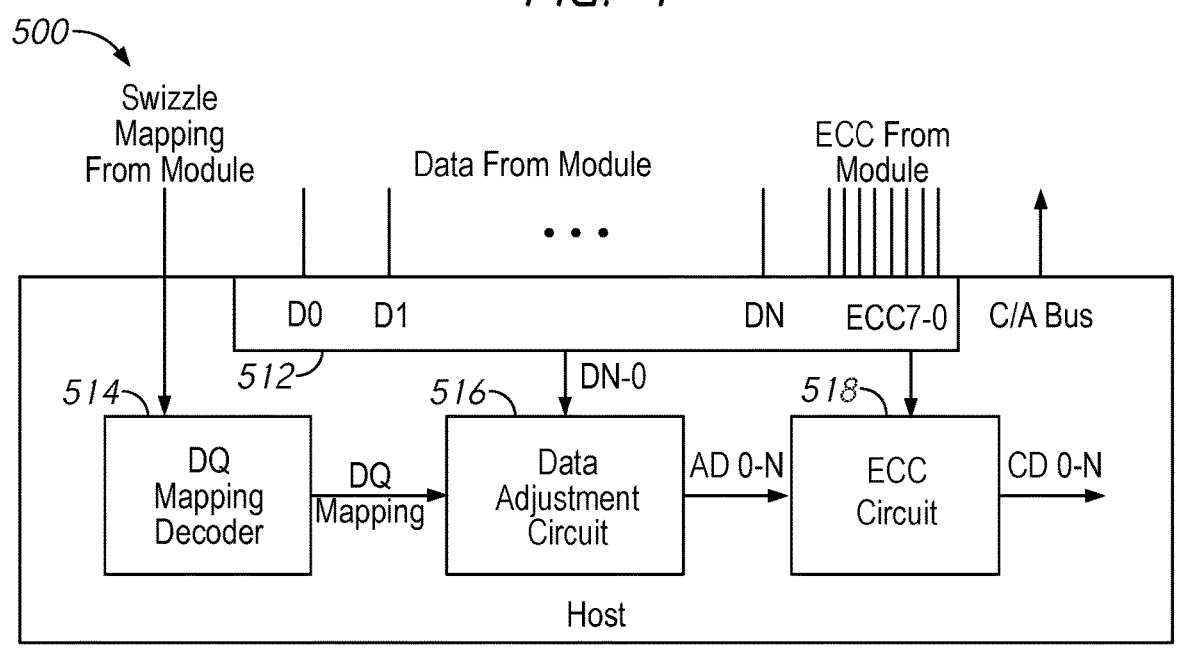
FIG. 5 is a schematic block diagram of a host, in accordance with an embodiment of the disclosure.

The DQ data from SWL drivers 410(0)-(3) may be data retrieved from a memory cell array (not shown) and may be provided to the DQ mapping circuit 420 as DATA3-0. The DQ mapping circuit 420 may re-arrange the data3-0 based on a DQ mapping setting to provide output data to data terminals DQ3-0. The DQ mapping setting may be provided as a mode register setting and/or as an on-die fuse setting from a fuse array. The re-arrangement of the DATA3-0 may be re-arranged by the DQ mapping circuit 420 to compensate for in a different order when routed to data terminals of a memory module, for example via a swizzle. The mapping of the data terminals of the semiconductor device 400 to the data terminals of the memory module may be based on a layout of the semiconductor device among other semiconductor devices and circuitry on the memory module. A more robust ECC may be implemented when data remains arranged according to the SWL drivers 410(0)-(3) configured to provide read data to the data terminals DQ3-0, FIG. 5 is a schematic block diagram of a host 500, in accordance with an embodiment of the disclosure. The 400 may include a data input/output circuit 512, a DQ Mapping Decoder 514, a data adjustment circuit 516, and a ECC circuit 518. The host 500 may be configured to communicate with a memory module to send and receive data DN-0 and ECC data via a data bus, and command and address information via a command and address bus C/A. In some examples, the host 500 may in implemented in the host 126 of FIG. 1 and/or the host 240 of FIG. 2.

In some examples, rather than memory packages of a memory module re-mapping data, the host 500 may re-order data received from or provided to the memory module. For example, the data input/output circuit 512 may receive data DN-D0 and ECC data ECC7-0 via a data bus, and the DQ Mapping Decoder 514 may receive a swizzle mapping signal from the memory module. The data input/output circuit 512 may provide the data DN-DO to the data adjustment circuit 516 and the DQ Mapping Decoder 514 may provide a DQ mapping setting to the data adjustment circuit 516 based on the swizzle mapping signal from the module. The data adjustment circuit 516 may rearrange the data DN-0 in a different order based on the DQ mapping setting from the DQ Mapping Decoder 514 to provide adjusted data ADN-0. To rearrange the data, data adjustment circuit 516 may include switching circuitry controlled by the DQ mapping setting from the DQ Mapping Decoder 514. The re-arrangement may compensate for re-arrangement of data on the memory module. The DQ mapping setting may be provided from a SPD chip on the memory module. The AD7-0 from the data adjustment circuit 516 and the ECC7-0 data from the data input/output circuit 512 may be provided to the ECC circuit 518 to detect and correct errors to provide corrected data CD7-0. In some examples, rather than being provided directly to the ECC circuit 518, the ECC data ECC7-0 may be adjusted through the data adjustment circuit 516 based on the DQ mapping setting before being routed to the ECC circuit 518.

This remapping of data may be performed for both read and write operations. The remapping of data to undo the swizzle mapping may improve host ECC operations by facilitating more robust error detection and correction as compared with systems that do not change swizzle mapping by taking advantage of error correcting schemes that rely on particular architectures of a memory package or device.

Figure 6:
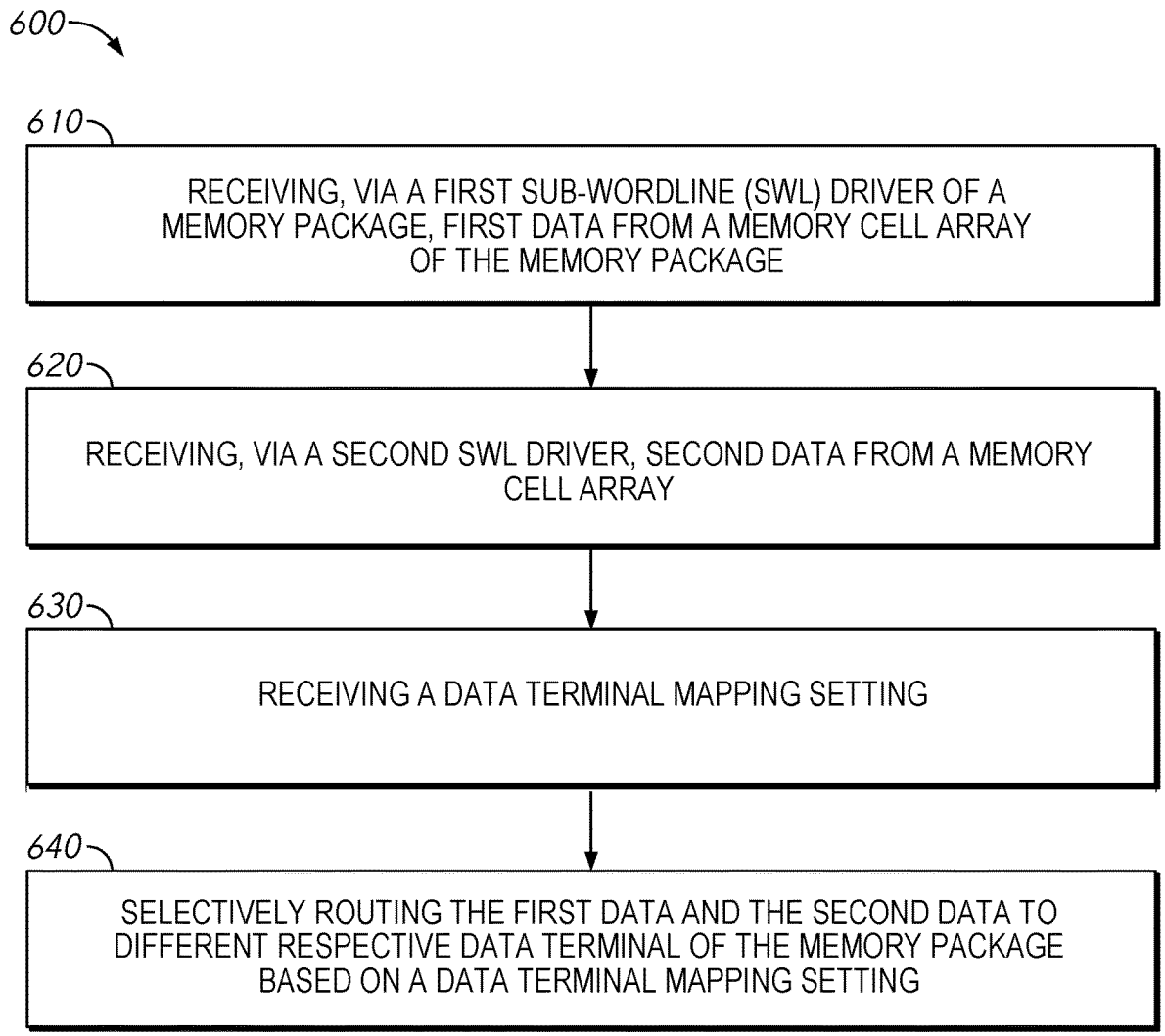
FIG. 6 is a flowchart of a method to rearrange data provided from a memory module, in accordance with an embodiment of the disclosure.

FIG. 6 is a flowchart of a method 600 to rearrange data provided from a memory module, in accordance with an embodiment of the disclosure. The method 600 may be implemented by any of the memory packages 125(0)-(8) of FIG. 1, the memory packages 212, 214, or 216 of FIG. 2, the semiconductor device 300 of FIG. 3, and/or the 400 of FIG. 4.

The method 600 may include receiving, via a first sub-wordline (SWL) driver of a memory package, first data from a memory cell array of the memory package, at 610. The method 600 may further include receiving, via a second SWL driver, second data from a memory cell array, at 620. The first and second SWL drivers may be include the any two of the SWL drivers 410(0)-(3) of FIG. 4, in an example.

The method 600 may further include receiving a data terminal mapping setting, at 630. In some examples, the method 600 may further include receiving the data terminal mapping setting from a mode register setting, such a mode register setting of the mode register 326 of FIG. 3. In some examples, the DQ mapping setting is based on routing of connections between data terminals DQ and an output of a memory module (e.g., swizzle routing) on the memory module. In some example, the method 600 may further include storing the data terminal mapping setting at a fuse array of the memory package.

Figure 7:
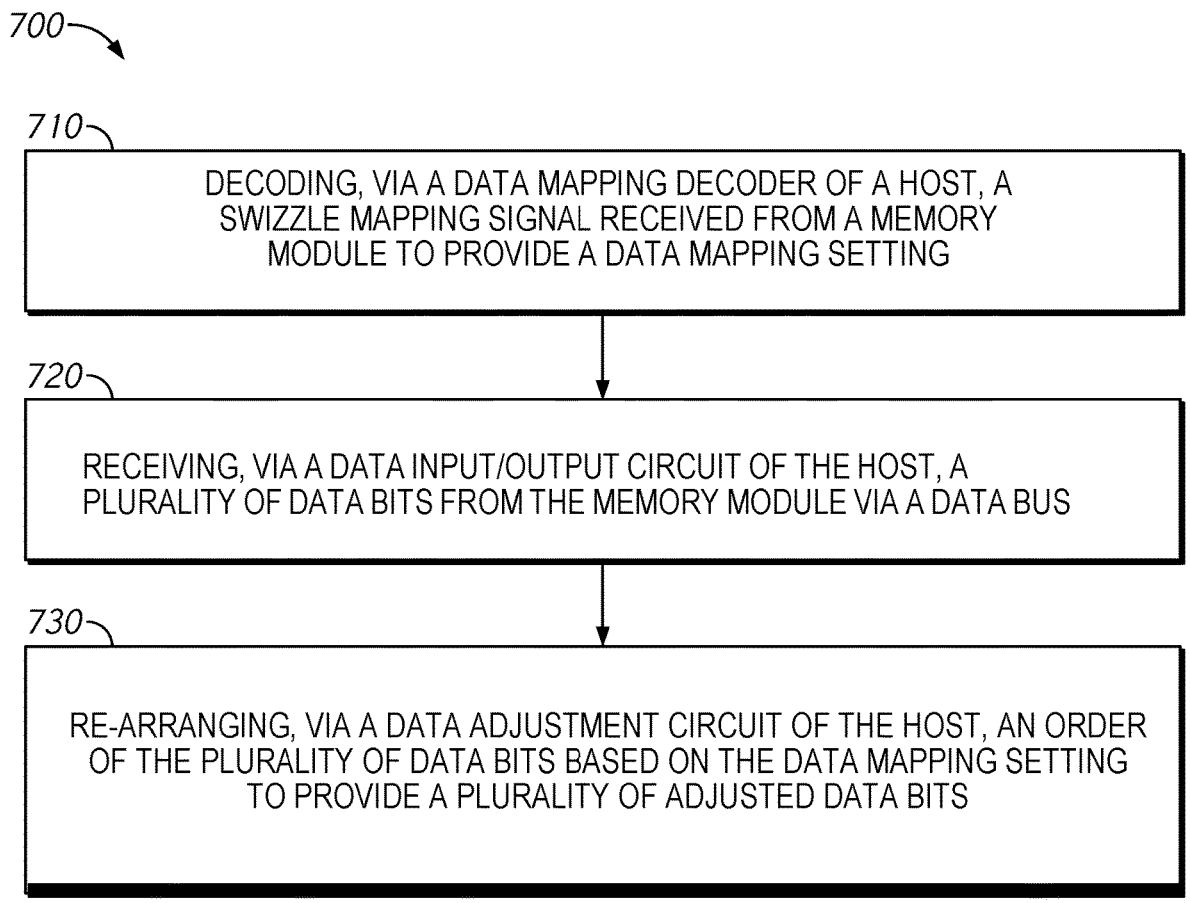
FIG. 7 is a flowchart of a method to rearrange data provided from a memory module, in accordance with an embodiment of the disclosure.

The method 600 may further include selectively routing the first data and the second data to different respective data terminal of the memory package based on a data terminal mapping setting, at 640. The first and second data may be selectively routed via a DQ mapping circuit, such as the DQ mapping circuits 130(7)-(0) of FIG. 1, the 213 and/or 215 of FIG. 2, the DQ mapping circuit 371 of FIG. 3, and/or the DQ mapping circuit 420 of FIG. 4. In some examples, the method 600 may further include selectively routing the first and second data to different respective data terminals via switching circuitry. In some examples, the method 600 may further include in response to the data terminal mapping setting having a first value: routing the first data to a first data terminal; and routing the second data to a second data terminal; and in response to the data terminal mapping setting having a second value: routing the first data to the second data terminal; and routing the second data to the first data terminal FIG. 7 is a flowchart of a method 700 to rearrange data provided from a memory module, in accordance with an embodiment of the disclosure. The method 700 may be implemented by any of the host 126 of FIG. 1, the host 240 of FIG. 2, and/or the host 500 of FIG. 5.

The method 700 may include decoding, via a data mapping decoder of a host, a mapping of connections between data terminals DQ and an output of a memory module (e.g., swizzle mapping) signal received from a memory module to provide a data mapping setting, at 710. The data mapping decoder may include the DQ Mapping Decoder 242 of FIG. 2 and/or the DQ Mapping Decoder 514 of FIG. 5, in some examples. In some examples, the method 700 may include receiving the swizzle mapping signal from a serial presence detect chip of the memory module. In some examples, the swizzle mapping signal is based on swizzle mapping between data terminals of memory packages of the memory module and module data terminals of the memory module.

The method 700 may further include receiving, via a data input/output circuit of the host, a plurality of data bits from the memory module via a data bus, at 720. The data input/output circuit may include the DQ mapping decoder 140 of FIG. 1, the DQ Mapping Decoder 242 of FIG. 2, and/or the data input/output circuit 512 of FIG. 5, in some examples.

The method 700 may further include re-arranging, via a data adjustment circuit of the host, an order of the plurality of data bits based on the data mapping setting to provide a plurality of adjusted data bits, at 730. The data adjustment circuit may include the data input/output circuit 142 of FIG. 1, the data adjustment circuit 246 of FIG. 2, and/or the data adjustment circuit 516 of FIG. 3.

In some examples, the method 700 may include detecting and/or correcting errors in the data received from the memory module based on an error correction code (ECC) received from the memory module. Error correction and detection may be performed via the ECC circuit 248 of FIG. 2 and/or the ECC circuit 518 of FIG. 5, in some examples. In some examples, the method 700 may include adjusting the ECC based on the data mapping setting prior to detecting and/or correcting the errors in the data.

Note that while FIGS. 1-7 are primarily focused on provision of read data from a memory package/memory module to a host, similar data adjustment may be performed when providing write data to the memory module/memory packages via the host without departing from the scope of the disclosure.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
   a first sub-wordline (SWL) driver configured to provide first data from a memory cell array;
   a second SWL driver configured to provide second data from the memory cell array; and
   an input/output (I/O) circuit configured to receive the first data and the second data from the first and second SWL drivers, respectively, the I/O circuit including a data terminal mapping circuit configured to selectively route the first data and the second data to different respective data terminals based on a data terminal mapping setting.

2. The apparatus of claim 1, further comprising a mode register configured to provide the data terminal mapping setting to the data terminal mapping circuit.

3. The apparatus of claim 1, further comprising a fuse array configured to store the data terminal mapping circuit.

4. The apparatus of claim 1, wherein the data terminal mapping circuit comprises switching circuitry configured to selectively route the first and second data to different respective data terminals.

5. The apparatus of claim 1, wherein the data terminal mapping setting is based on swizzle routing on a memory module.

6. The apparatus of claim 1, wherein the data terminal mapping circuit is configured to route the first data to a first data terminal and the second data to a second data terminal in response to the data terminal mapping setting having a first value, wherein the data terminal mapping circuit is configured to route the first data to the second data terminal and the second data to the first data terminal in response to the data terminal mapping setting having second value.

7. The apparatus of claim 6, further comprising the first data terminal configured to be coupled to a first module data terminal and the second data terminal configured to be coupled to a second module data terminal.

8. The apparatus of claim 7, wherein an order from most significant bit to least significant bit of the first data terminal and the second data terminal is different than an order from most significant bit to least significant bit of the first module data terminal and the second module data terminal.

9. The apparatus of claim 7, further comprising the memory cell array coupled to the first and second SWL drivers and configured to provide the first and second data.

10. A memory module comprising:
    first and second module data terminals;
    a memory package having first and second data terminals; and
    a swizzle configured to map the first and second data terminals of the memory package to the first and second module data terminals,
    wherein the memory package includes a data terminal mapping circuit configured to selectively arrange data provided to the first and second data terminals based on a mapping between the first and second data terminals of the memory package and the first and second module data terminals, and
    wherein, in response to the first data terminal being coupled to the first module data terminal and the second data terminal being coupled to the second module data terminal, the data terminal mapping circuit is configured to map first data from a first sub-wordline driver to the first data terminal and second data from a second sub-wordline driver to the second data terminal.

11. The memory module of claim 10, wherein, in response to the first data terminal being coupled to the second module data terminal and the second data terminal being coupled to the first module data terminal, the data terminal mapping circuit is configured to map the second data from the second sub-wordline driver to the first data terminal and the second data from the second sub-wordline driver to the first data terminal.

12. The memory module of claim 10, wherein the memory package is configured to store a mode register setting that indicates the mapping between the first and second data terminals of the memory package and the first and second module data terminals.

13. The memory module of claim 12, further comprising a fuse array configured to store the mode register setting.

14. A method comprising:
    receiving, via a first sub-wordline (SWL) driver of a memory package, first data from a memory cell array of the memory package;
    receiving, via a second SWL driver, second data from the memory cell array;
    receiving a data terminal mapping setting; and
    selectively routing the first data and the second data to different respective data terminals of the memory package based on a data terminal mapping setting.

15. The method of claim 14, further comprising receiving the data terminal mapping setting from a mode register setting.

16. The method of claim 14, further comprising selectively routing the first and second data to different respective data terminals via switching circuitry.

17. The method of claim 14, wherein the data mapping setting is based on swizzle routing on a memory module.

18. The method of claim 14, further comprising:
    in response to the data terminal mapping setting having a first value:
    routing the first data to a first data terminal; and
    routing the second data to a second data terminal; and
    in response to the data terminal mapping setting having a second value:
    routing the first data to the second data terminal; and
    routing the second data to the first data terminal.

19. The method of claim 14, further comprising storing the data terminal mapping setting at a fuse array of the memory package.

* * * * *